United States Patent [19]
Michiyama et al.

[11] Patent Number: 5,936,231
[45] Date of Patent: Aug. 10, 1999

[54] PHOTOELECTRIC SENSOR CIRCUIT COMPRISING AN AUXILIARY PHOTODIODE AND A CURRENT MIRROR CIRCUIT

[75] Inventors: Katsunori Michiyama, Toyota; Keiji Horiba, Nishikasugai-gun, both of Japan

[73] Assignee: Denso Corporation, Kariya, Japan

[21] Appl. No.: 08/871,969

[22] Filed: Jun. 10, 1997

[30] Foreign Application Priority Data

Jun. 10, 1996 [JP] Japan ................................. 8-147585

[51] Int. Cl.$^6$ ................................ H01J 40/14; G01J 1/44
[52] U.S. Cl. .................... 250/214 A; 330/288; 330/308; 327/514
[58] Field of Search ............................ 250/214 R, 214 A, 250/214 AG, 214 AL, 214 B, 214 C, 206.1, 206.2; 327/514, 515; 330/288, 59, 308

[56] References Cited

U.S. PATENT DOCUMENTS

| | | | |
|---|---|---|---|
| 3,822,387 | 7/1974 | Mulder | 330/288 |
| 4,118,621 | 10/1978 | Monticelli et al. | 330/288 |
| 4,439,673 | 3/1984 | Gontowski, Jr. | 250/214 A |
| 4,454,416 | 6/1984 | Gontowski, Jr. et al. | 250/214 A |
| 4,467,191 | 8/1984 | Chalfin et al. | 250/214 A |
| 4,485,301 | 11/1984 | Gontowski, Jr. et al. | 250/214 A |
| 4,812,726 | 3/1989 | Benii et al. | |
| 5,004,901 | 4/1991 | Yoshimoto et al. | |
| 5,030,821 | 7/1991 | Fukuyama | |
| 5,030,822 | 7/1991 | Fukuyama | |
| 5,034,600 | 7/1991 | Fukuyama | |
| 5,034,601 | 7/1991 | Fukuyama | |
| 5,059,782 | 10/1991 | Fukuyama | |
| 5,059,809 | 10/1991 | Fukuyama | |
| 5,117,118 | 5/1992 | Fukuyama | |
| 5,162,754 | 11/1992 | Soares et al. | 330/308 |
| 5,256,986 | 10/1993 | Flocke et al. | 250/214 A |
| 5,317,143 | 5/1994 | Yoshimoto et al. | |

FOREIGN PATENT DOCUMENTS 5-209788  8/1993  Japan .

*Primary Examiner*—Edward P. Westin
*Assistant Examiner*—John R. Lee
*Attorney, Agent, or Firm*—Pillsbury Madison & Sutro LLP

[57] ABSTRACT

When a third transistor receives first photoelectric currents outputted from a sensing photodiode, the third transistor provides second photoelectric currents to bases of a first transistor and a second transistor, then the first transistor turns on and carries the first photoelectric currents, so first currents corresponding to the first photoelectric currents flow to a first terminal. Thus, the first photoelectric currents can be directly outputted from the first terminal. On the other hand, the second transistor also turns on and carries second currents corresponding to amplified first photoelectric currents, so the second currents flow to a third terminal. Thus, the amplified first photoelectric currents can be outputted from the third terminal.

16 Claims, 3 Drawing Sheets

PHOTOELECTRIC SENSOR CIRCUIT COMPRISING AN AUXILIARY PHOTODIODE AND A CURRENT MIRROR CIRCUIT

CROSS REFERENCE TO RELATED APPLICATION

This application is based on and claims priority of Japanese Patent Application No. Hei. 8-147585 filed on Jun. 10, 1996, the content of which is incorporated herein by reference.

BACKGROUND OF THE INVENTION

1. Field of the Invention

The present invention relates to a photoelectric sensor circuit, which is conveniently used for a solar sensor disposed in an auto air conditioner system in a vehicle and for a light-receiving sensor disposed in an automatic light control system in the vehicle.

2. Description of Related Art

In general, a photodiode is used as a photoelectric sensing element in a conventional photoelectric sensor circuit. For instance, when the photodiode is used as a solar sensor disposed in an automatic air conditioner system in a vehicle, an amplifier circuit is not needed because the photodiode is used in a high illuminance range and outputs high level output currents (photoelectric currents). On the other hand, when the photodiode is used as a light-receiving sensor disposed in an automatic light control system in the vehicle, the amplifier circuit is needed because the photodiode is used in a low illuminance range and outputs low level output currents (photoelectric currents).

Both the solar sensor and the light-receiving sensor are usually disposed in a same area in the vehicle, for instance, on a dashboard, so it has been required to use the photodiode as both the solar sensor and the light-receiving sensor to decrease the number of parts in the photoelectric sensor circuit. In order to satisfy the above requirement, one terminal for directly outputting photoelectric currents from the photodiode and another terminal for outputting photoelectric currents amplified by the amplifier circuit are needed in the photoelectric sensor circuit. In this case, if the amplifier circuit is constructed as a current mirror circuit, the photoelectric sensor circuit has some advantages, for instance, it is easy to dispose both terminals in the photoelectric sensor circuit, and it is not necessary for the amplifier circuit to dispose a particular power source.

A conventional photoelectric sensor circuit which amplifies photoelectric currents from a photodiode by means of a current mirror circuit is disclosed in U.S. Pat. No. 5,004,901 (Yoshimoto et al.). As shown in FIG. 5 illustrated in Yoshimoto et al., a photodiode 1 receives reverse bias voltage from a power terminal +$V_{cc}$. A current mirror circuit includes a transistor 3 in which most photoelectric currents from the photodiode 1 flow as collector currents $I_9$ therein, five transistors 4–8 in which collector currents $I_{10}$–$I_{14}$ having the same magnitude as the collector currents $I_9$ flow therein, and a transistor 2 which amplifies part of the photoelectric currents from the photodiode 1 and provides the transistors 3–8 with them as base currents. According to these structures, the magnitudes of the output currents $I_{out}$ are five times as large as the photoelectric currents from the photodiode 1, so the current mirror circuit operates as an amplifier circuit, and a specialized power source is not necessary for the amplifier circuit.

The inventors of the present invention conceived of another photoelectric sensor circuit as illustrated in FIG. 6 (not known), based on the above photoelectric sensor circuit described in U.S. Pat. No. 5,004,901 so that the photoelectric sensor circuit directly outputs the photoelectric currents from the photodiode 1. As shown in FIG. 6, a photoelectric sensor circuit includes an output terminal 11 in which currents $I_{out'}$ which depend on photoelectric currents from the photodiode 1 flow therein. According to the photoelectric sensor circuit illustrated in FIG. 6, the photodiode 1 can be used as both a solar sensor and a light-receiving sensor and the photoelectric sensor circuit can be used as a unit that unifies both the solar sensor and the light-receiving sensor.

Considering circuits disposed in a vehicle, it is desirable to minimize the number of wires which electrically connect one circuit terminal to another circuit terminal. Of course, it is necessary to decrease the number of terminals in the circuit in order to decrease the number of wires. However, if the photoelectric sensor circuit is constructed to output two kinds of photoelectric currents, the photoelectric sensor circuit needs four terminals as shown in FIG. 6, that is, a power terminal +$V_{cc}$, two output terminals 10, 11 and a ground terminal 13. Thus, it is necessary to decrease the number of wires in the photoelectric sensor circuit even if the photoelectric sensor circuit includes one terminal for directly outputting the photoelectric currents from the photodiode and another terminal for outputting the amplified the photoelectric currents.

SUMMARY OF THE INVENTION

In view of the above problems of the related art, an object of the present invention is to decrease the number of terminals in a photoelectric sensor circuit, even if the photoelectric sensor circuit is constructed to output two kinds of photoelectric currents.

In order to accomplish the above-described object, the present invention has not only a sensing photodiode for outputting first photoelectric currents when the sensing photodiode receives external illumination but also an auxiliary photodiode for outputting second photoelectric currents when the sensing photodiode receives external illumination.

In the present invention, when a third transistor receives first photoelectric currents outputted from a sensing photodiode, the third transistor provides second photoelectric currents to bases of a first transistor and a second transistor, then the first transistor turns on and carries the first photoelectric currents, so first currents corresponding to the first photoelectric currents flow to a first terminal. Thus, the first photoelectric currents can be directly outputted from the first terminal.

On the other hand, the second transistor also turns on and carries second currents corresponding to amplified first photoelectric currents, so the second currents flow to a third terminal. Thus, the amplified first photoelectric currents can be outputted from the third terminal.

Therefore, the present invention can decrease the number of terminals in the photoelectric sensor circuit even if the photoelectric sensor circuit includes one terminal for directly outputting the photoelectric currents from the photodiode and another terminal for outputting the amplified the photoelectric currents.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PREFERRED EMBODIMENTS

Preferred embodiments of the present invention are described hereinafter with reference to the accompanying drawings.

Figure 1:
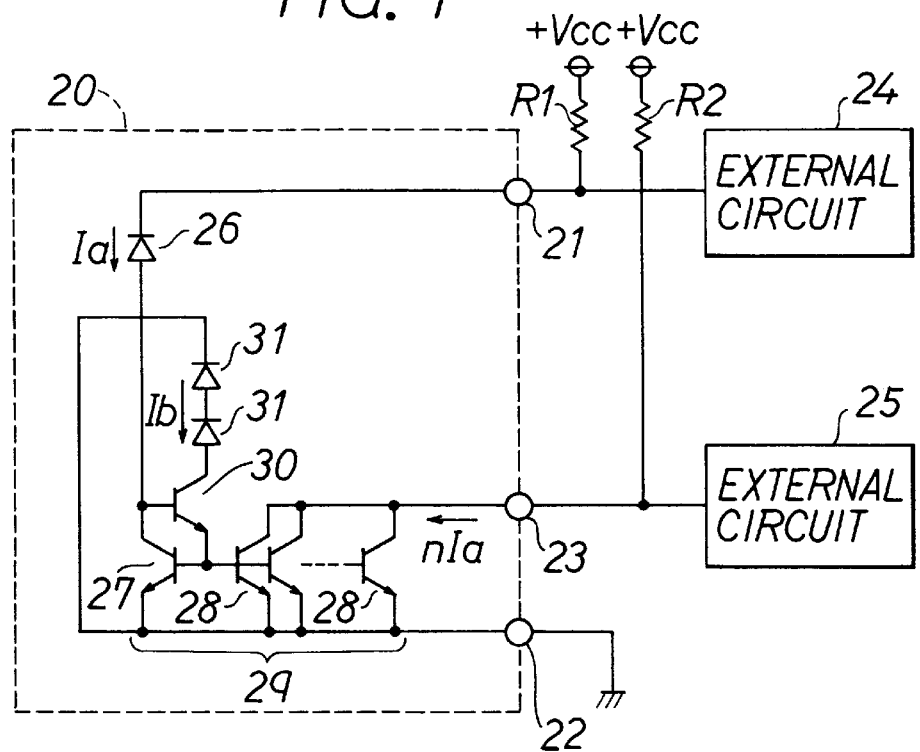
FIG. 1 is a circuit diagram of a photoelectric sensor circuit according to a first preferred embodiment of the present invention.

FIG. 1 shows a circuit diagram of a photoelectric sensor circuit according to a first preferred embodiment of the present invention. As shown in FIG. 1, a sensor unit 20 as a photoelectric sensor circuit includes a first terminal 21, a second terminal 22 and a third terminal 23. The first terminal 21 is connected to a power terminal +$V_{cc}$ via a resistance R1, and also connected to an external circuit 24 which receives an output from the sensor unit 20. The second terminal 22 is connected to the ground. The third terminal 23 is connected to the power terminal +$V_{cc}$ via a resistance R2, and also connected to an external circuit 25 which receives an output from the sensor unit 20.

Further, the sensor unit 20 is constructed as follows. A sensing photodiode 26 is provided for receiving external illumination, and a cathode of the sensing photodiode 26 is connected to the first terminal 21, and an anode of the sensing photodiode 26 is connected to the second terminal 22 via a collector and an emitter of a npn type first transistor 27. According to the above connection, the sensing photodiode 26 is given a reverse bias through the first terminal 21 to the second terminal 22. A plurality of npn type second transistors 28 have the same features as the first transistor 27 and are connected in parallel to one another so that the first transistor 27 and the second transistors 28 comprise a current mirror circuit 29. It is easy to match the parameters of the first transistor 27 and the second transistors 28 if all of the transistors are formed in a monolithic integrated circuit.

With regard to the current mirror circuit 29, each collector of the second transistors 28 is connected to the third terminal 23, each emitter of the second transistors 28 is connected to the second terminal 22 and each base of the second transistors 28 is connected to a base of the first transistor 27. Furthermore, an npn type third transistor 30 for providing the first transistor 27 and the second transistors 28 with base currents, and two auxiliary photodiodes 31 which are provided for receiving external illumination are disposed in the current mirror circuit 29. A base of the third transistor 30 is connected to the anode of the sensing photodiode 26, an emitter of the third transistor 30 is connected to the base of the first transistor 27 and each base of the second transistors 28, and a collector of the third transistor 30 is connected to the second terminal 22 via the auxiliary photodiodes 31. According to the above current mirror circuit 29, photoelectric currents $I_a$ from the sensing photodiode 26 are provided to the third transistor 30 as the base currents, and then, photoelectric currents $I_b$ from the auxiliary photodiodes 31 are provided to the first transistor 27 and the second transistors 28 via the third transistor 30 as the base currents.

The operation of this embodiment is as follows. The sensing photodiode 26 and the auxiliary photodiodes 31 output photoelectric currents $I_a$ and $I_b$ corresponding to a quantity of received light when they receive external illumination. Then, because part of the photoelectric currents $I_a$ from the sensing photodiode 26 flow into the base of the third transistor 30, the third transistor 30 turns on. Next, because the photoelectric currents $I_b$ from the auxiliary photodiode 31 flow into the base of the first transistor 27 as base currents, the first transistor 27 turns on. Thus, the photoelectric currents $I_a$ from the sensing photodiode 26 flow from the first terminal 21 to the second terminal 22 via the first transistor 27, and the photoelectric currents $I_a$ flow directly to the first terminal 21. When the photoelectric currents $I_a$ flow directly to the first terminal 21, currents corresponding to the photoelectric currents $I_a$ flow to the resistor R1 and the voltage corresponding to the photoelectric currents $I_a$ drops at the first terminal 21. The external circuit 24 detects a voltage drop at the first terminal 21 and converts the voltage drop into intensity of the external illumination to use it for various vehicle control systems.

In this case, the base currents of the transistor 30 which are part of the photoelectric currents $I_a$ can be omitted because the magnitude of the base currents of the third transistor 30 is proportional to $1/h_{FE}$, where $1/h_{FE}$ is an amplification factor of direct currents of the third transistor 30, as compared to that of the photoelectric currents $I_a$. The photoelectric currents $I_b$ from the auxiliary photodiode 31 are provided to not only the first transistor 27 as the base currents but also to in parallel to the plurality of second transistors 28 connected in parallel to one another as the base currents.

According to this embodiment, since the second transistors 28 have parameters matched to those of the first transistor 27, currents which have the same magnitude as the photoelectric currents $I_a$ from the sensing photodiode 26 (collector currents flowing in the first transistor 27) flow in each of the plurality of second transistors 28 as the collector currents. In this case, because output currents of the plurality of second transistors 28 flow from the third terminal 23, currents which flow from the third terminal 23 to the second transistors 28 are amplified n times as the photoelectric currents $I_a$ from the sensing photodiode 26, where "n" is the number of the second transistors, and are outputted from the third terminal 23 as amplified currents $nI_a$. When the amplified currents $nI_a$ flow to the third terminal 23, currents corresponding to the amplified currents $nI_a$ flow to the resistor R2 and the voltage corresponding to the amplified currents $nI_a$ drops at the third terminal 23. The external circuit 25 detects a voltage drop at the third terminal 23 and converts the voltage drop into intensity of the external illumination to use it for various vehicle control systems.

In this embodiment, although the sensor unit 20 includes a first terminal 21 for outputting the photoelectric currents $I_a$ from the sensing photodiode 26 and the third terminal 23 for outputting the amplified currents $nI_a$ that are the amplified photoelectric currents $I_a$, it is not necessary to provided a power supply for an amplifier circuit. If the sensing photodiode 26 in the sensor unit 20 is used as both a solar sensor disposed in an auto air conditioner system in a vehicle and a light-receiving sensor disposed in an automatic light control system in the vehicle, the number of terminals in the sensor circuit 20 is decreased because all that is necessary is to dispose the second terminal 22 in addition to the first terminal 21 and the third terminal 23.

Further, in this embodiment, because there are two auxiliary photodiodes 31, both of which are connected in series in the sensor circuit 20, the photoelectric currents $I_a$ from the sensing photodiode 26 cannot flow backwards via the pn-junction between the base and the collector of the third transistor 30 and the auxiliary photodiodes 31. That is, if the active portion of first transistor 27, the second transistors 28, the third transistor 30 and the auxiliary photodiodes 31 are made from the same materials, for instance silicon, the voltage at the base of the third transistor 30, that is, the total voltage drop between the base and the emitter of the third transistor 30 plus the drop between the base and the emitter of the first transistor 27 is about 1.4 volts. If there is only one auxiliary photodiode 31, because the total voltage drop between the anode and the cathode of the auxiliary photodiode 31 plus the drop between the base and the collector of the third transistor 30 is also about 1.4 volts, the photoelectric currents $I_a$ may flow backwards as described above. On the other hand, if two auxiliary photodiodes 31 are connected in series, because the total voltage drop between the anodes and the cathodes of the auxiliary photodiodes 31 plus the drop between the base and the collector of the third transistor 30 is about 2.1 volts, the photoelectric currents $I_a$ never flow backwards.

Figure 2:
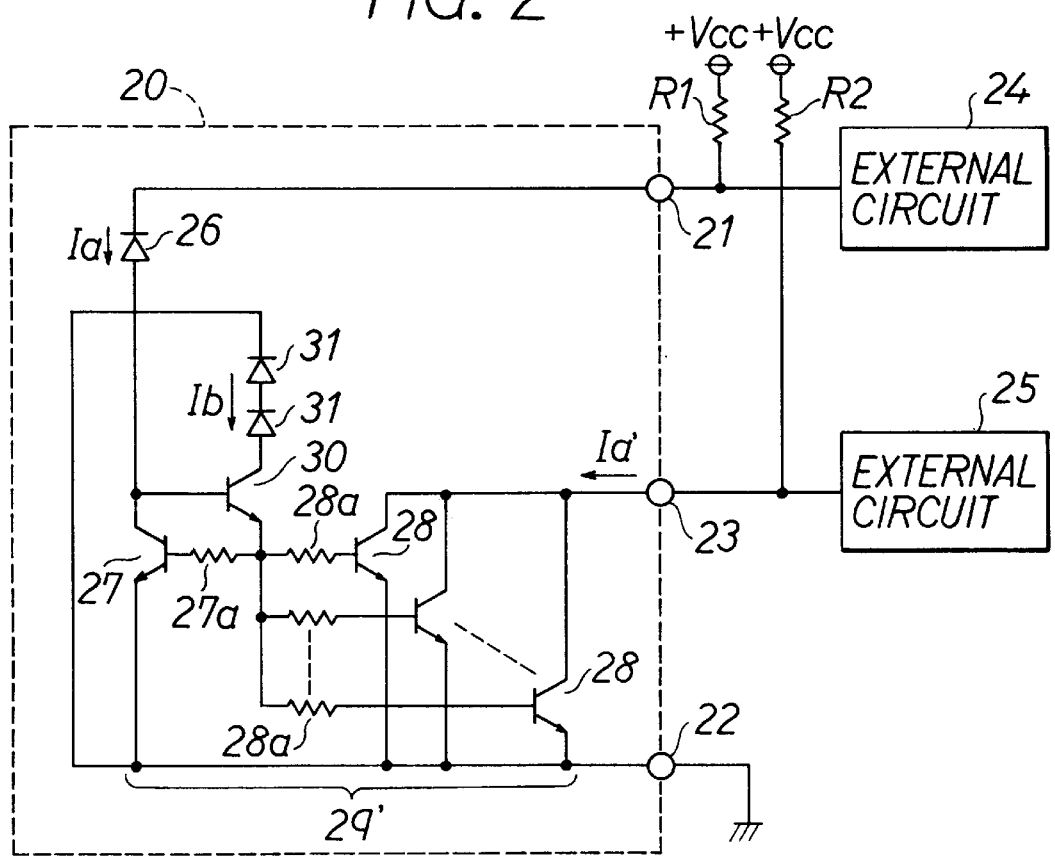
FIG. 2 is a circuit diagram of a photoelectric sensor circuit according to a second preferred embodiment of the present invention.

FIG. 2 is a circuit diagram of a photoelectric sensor circuit according to a second preferred embodiment of the present invention. In the first preferred embodiment, the first transistor 27 and the second transistors 28 which are part of the current mirror circuit 29 have matched parameters, so an amplification factor of the amplified current $nI_a$ is an integral multiple (n times) of the photoelectric currents $I_a$. On the other hand, the sensor unit 20 described in the second preferred embodiment is characterized by being capable of changing its current amplification factor.

As shown in FIG. 2, the first transistor 27 and the second transistors 28 which form a current mirror circuit 29' are formed on the same IC chip, and especially each emitter area of the plurality of the second transistors 28 is different. For instance, when three second transistors 28 are provided in the sensor circuit 20, if the emitter area of the first transistor 27 is set as a unit area 1, the three second transistors 28 are formed so that the emitter areas of the three second transistors 28 are set as 1:½:¼. The base of the first transistor 27 and the bases of the second transistors 28 are connected to one another via a thin film base resistance 27a and thin film base resistances 28a both formed on the IC chip. If the base resistances 28a are selectively cut by a laser, the magnitude of amplified currents $I_{a'}$ which flow to the third terminal 23 from the sensing photodiode 26 can be changed in increments of ¼ $I_a$ from ¼ $I_a$ to ⅞ $I_a$; that is, the current amplification of the photoelectric currents $I_a$ can be coordinated in 7 stages. Further, if more than three second transistors 28 are formed in the sensor unit 20 and the emitter areas of the second transistors 28 are different from one another, it is possible to set the current amplification factor in greater detail.

Figure 3:
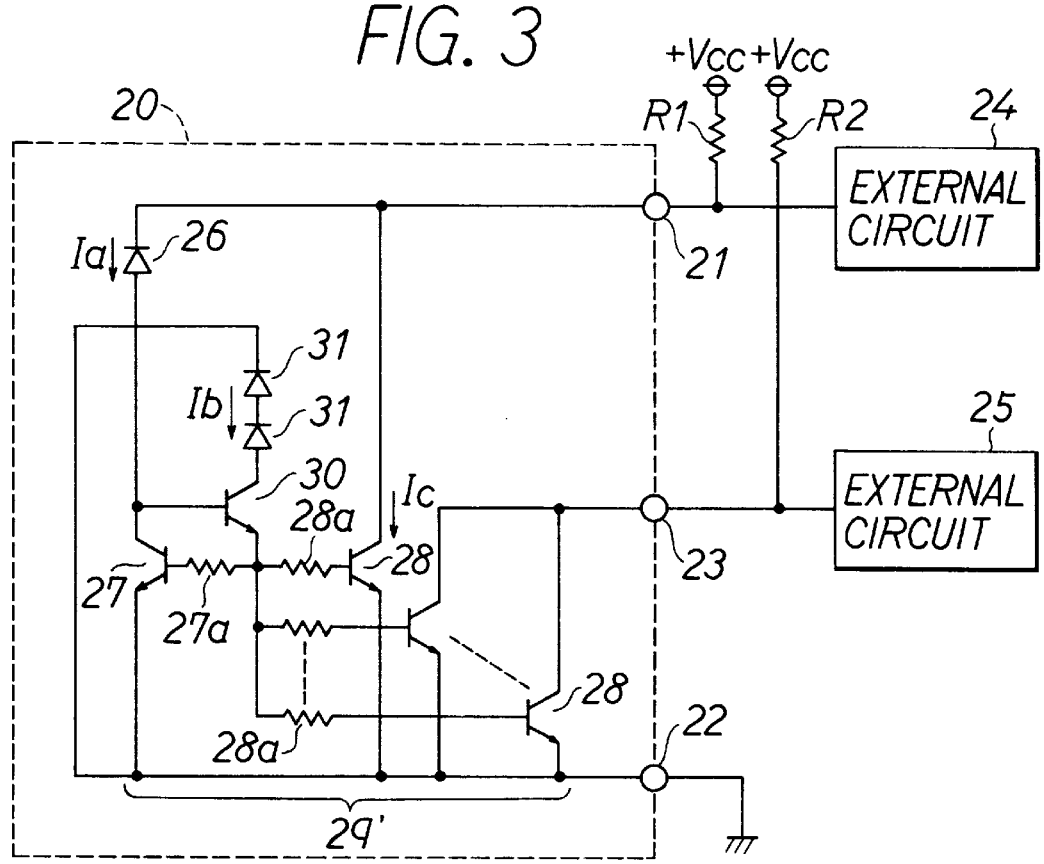
FIG. 3 is a circuit diagram of a photoelectric sensor circuit according to a third preferred embodiment of the present invention.

FIG. 3 is a circuit diagram of a photoelectric sensor circuit according to a third preferred embodiment of the present invention, and only parts different from the second preferred embodiment will be described as follows. As shown in FIG. 3, the sensor unit 20 according to the third preferred embodiment is characterized by one of the second transistors 28 being connected between the first terminal 21 and the second terminal 22.

According to this embodiment, not only the photoelectric currents $I_a$ from the sensing photodiode 26 but also the collector currents of the second transistor 28 disposed between the first terminal 21 and the second terminal 22 flow to the first terminal 21. In this case, if the base resistances 28a are selectively trimmed by the laser, it is possible to control not only the currents which flow to the first terminal 21 but also the currents which flow to the third terminal 23.

Figure 4:
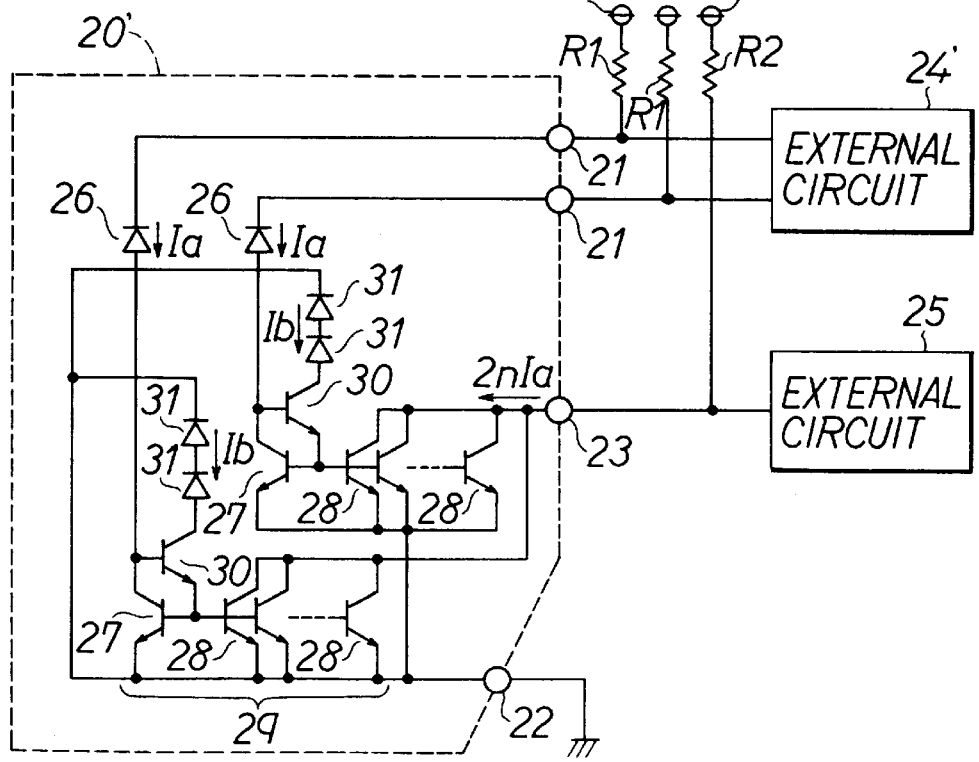
FIG. 4 is a circuit diagram of a photoelectric sensor circuit according to a fourth preferred embodiment of the present invention.

FIG. 4 is a circuit diagram of a photoelectric sensor circuit according to a fourth preferred embodiment of the present invention, and only parts different from the first preferred embodiment will be described as follows. As shown in FIG. 4, a sensor unit 20' includes two sets of sensing photodiodes 26 and two sets of current mirror circuits 29. Two sets of first terminals 21 corresponding to the two sets of sensing photodiodes 26 are connected to the power terminals $+V_{cc}$ via resistances R1 and to the external circuit 24.

According to this embodiment, if the light receiving direction of the two sets of sensing photodiodes 26 is different from one another, it is possible to determine the direction of reception of the external illumination. Further, because a total of the external illumination received by the two sets of sensing photodiodes 26 can be detected based on amplified currents which flow to the third terminal 23, it is possible to detect not only the direction of the external illumination but also the total external illumination received by the sensing photodiodes 26. If the sensing photodiode 26, the current mirror circuit 29 and the first terminal 21 are disposed deep inside in the sensor unit 20 so that shadows are cast thereon by slanting illumination, it is possible to detect the direction of the external illumination in detail.

Figure 5:
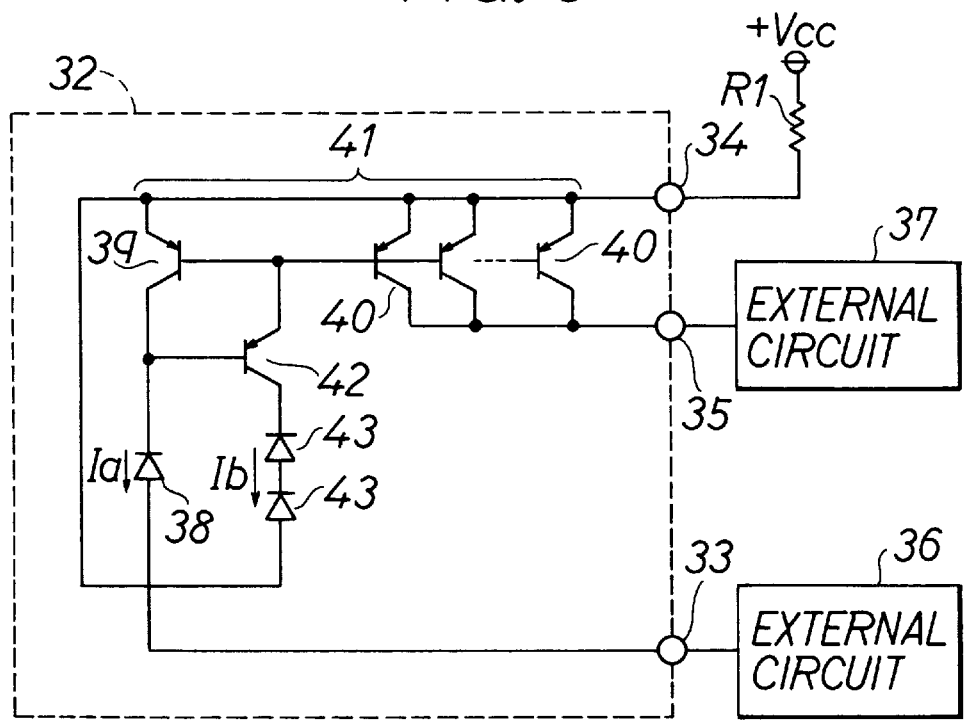
FIG. 5 is a circuit diagram of a photoelectric sensor circuit according to a fifth preferred embodiment of the present invention.
Figure 6:
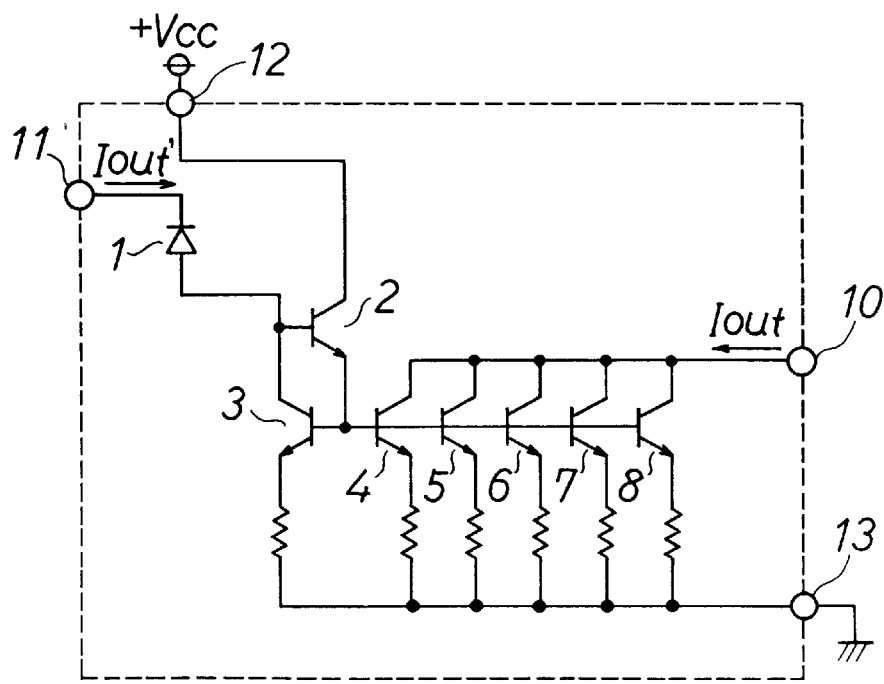
FIG. 6 is a circuit diagram of a photoelectric sensor circuit according to a related art.

FIG. 5 is a circuit diagram of a photoelectric sensor circuit according to a fifth preferred embodiment of the present invention. As shown in FIG. 5, this embodiment uses pnp type transistors to form the current mirror circuit instead of npn type transistors as described in the first preferred embodiment. A sensor unit 32 includes a first terminal 34, a second terminal 33 and a third terminal 35. The first terminal 33 is connected to an external circuit 36, the second terminal 34 is connected to a power terminal $+V_{cc}$, and the third terminal 35 is connected to an external circuit 37.

Further, the sensor unit 32 is constructed as follows. A sensing photodiode 38 is disposed for receiving external illumination, and an anode of the sensing photodiode 38 is connected to the first terminal 33, and a cathode of the sensing photodiode 38 is connected to the second terminal 34 via a collector and a emitter of a pnp type first transistor 39. According to the above connection, the sensing photodiode 38 is given a reverse bias through the second terminal 34 to the first terminal 33. A plurality of pnp type second transistors 40 have the same features as the first transistor 39 and are connected in parallel to one another so that the first transistor 39 and the second transistors 40 form a current mirror circuit 41. It is possible to alter the emitter area of the second transistors 40 as described in the second preferred embodiment.

With regard to the current mirror circuit 41, each collector of the second transistors 40 is connected to the third terminal 35, each emitter of the second transistors 40 is connected to the second terminal 34 and each base of the second transistors 40 is connected to a base of the first transistor 39. Furthermore, a pnp type third transistor 42 for providing the first transistor 39 and the second transistors 40 with base currents, and two auxiliary photodiodes 43 which are disposed for receiving the external illumination are disposed in the current mirror circuit 42. A base of the third transistor 42 is connected to the cathode of the sensing photodiode 38, an emitter of the third transistor 42 is connected to the base of the first transistor 39 and each base of the second transistors 40, and a collector of the third transistor 42 is connected to the second terminal 34 via the auxiliary photodiodes 43. According to the above current mirror circuit 41, photoelectric currents $I_a$ from the sensing photodiode 38 are provided to the third transistor 42 as the base currents, and then, photoelectric currents $I_b$ from the auxiliary photodiodes 43 are provided to the first transistor 39 and the second transistors 40 as base currents.

The present invention may be embodied in other specific forms without departing from the spirit or essential characteristics thereof. For instance, if an integral multiple amplification factor is not needed, it is not necessary to match the features and the emitter area of the second transistors with the those of the first transistor, and if the total of the emitter areas of the second transistors is larger than that of the first transistor, it is not necessary to use a plurality of other second transistors. It is possible to connect more than two auxiliary photodiodes in series.

The present embodiments are therefore to be considered in all respects as illustrative and not restrictive, the scope of the invention being indicated by the appended claims rather than by the foregoing description, and all changes which come within the meaning and range of equivalency of the claims are therefore intended be embraced therein.

What is claimed is:

1. A photoelectric sensor circuit comprising:

a sensing photodiode for outputting a first photoelectric current when said sensing photodiode receives external illumination;

an auxiliary photodiode for outputting a second photoelectric current when said auxiliary photodiode receives external illumination;

a first terminal connected to one side of said sensing photodiode;

a second terminal connected to the other side of said sensing photodiode, wherein a reverse-biasing voltage is applied to said sensing photodiode between said first and second terminals, and a first current corresponding to said first photoelectric current flows between said first and second terminals when said sensing photodiode outputs said first photoelectric current;

a first transistor, connected to said sensing photodiode, for allowing said first current to flow in a direction of said reverse-biasing voltage between said first and second terminals while said first transistor is turned on;

a second transistor, one side of which is connected to said second terminal, for amplifying said first photoelectric current into a second current, said first transistor and said second transistor forming a current mirror circuit;

a third terminal to which the other side of said second transistor is connected, wherein said second current flows between said second and third terminals when said second transistor is turned on;

a third transistor, a base of which is connected to said sensing photodiode, and interposed between said auxiliary photodiode and bases of said first and second transistors, wherein said third transistor provides said second photoelectric current to said base of said first and second transistors to turn said first and second transistors on while being turned on by said first photoelectric current supplied to said base thereof.

2. A photoelectric sensor circuit according to claim 1, further comprising:

another sensing photodiode, disposed in parallel to said sensing photodiode, for outputting another first photoelectric current when said another sensing photodiode receives external illumination;

another auxiliary photodiode, disposed in parallel to said auxiliary photodiode, for outputting another second photoelectric current when said another auxiliary photodiode receives external illumination;

another first terminal connected to one side of said another sensing photodiode wherein a reverse-biasing voltage is applied to said another sensing photodiode between said another first terminal and said second terminal, and another first current corresponding to said another first photoelectric current outputted from said another sensing photodiode flows between said another first terminal and said second terminal when said another sensing photodiode outputs said another first photoelectric current;

another first transistor, connected to said another sensing photodiode, for allowing said another first current to flow in a direction of said reverse-biasing voltage between said another first terminal and said second terminal while said another first transistor is turned on;

another second transistor, connected between said second and third terminals for amplifying said another first photoelectric current outputted from said another sensing photodiode into another second current, which flows between said second and third terminals when said another second transistor is turned on, said another first transistor and said another second transistor forming another current mirror circuit; and another third transistor, a base of which is connected to said another sensing photodiode, and interposed between said another auxiliary photodiode and bases of said another first transistor and said another second transistor, wherein said another third transistor provides said another second photoelectric current to said base of said another first transistor and said another second transistor to turn on while being turned on by said another first photoelectric current outputted from said another sensing photodiode supplied to said base thereof, wherein light receiving directions of said sensing photodiode and said another sensing photodiode are different from one another.

3. A photoelectric sensor circuit according to claim 1, wherein said second transistor includes a plurality of transistors connected in parallel with one another, and total currents outputted from said plurality of transistors are larger than said first photoelectric currents.

4. A photoelectric sensor circuit according to claim 3, wherein at least one of said plural transistors is connected between said first terminal and said second terminal.

5. A photoelectric sensor circuit according to claim 3, wherein an emitter area of each of said plurality of transistors is different.

6. A photoelectric sensor circuit according to claim 1, wherein said auxiliary photodiode includes at least two photodiodes connected in series.

7. A photoelectric sensor circuit according to claim 1, wherein the other side of said auxiliary photodiode is connected to said first transistor, said second transistor and said second terminal.

8. A photoelectric sensor circuit according to claim 7, wherein a voltage drop of said auxiliary photodiode is larger than a voltage drop between said second terminal and said base of said first transistor.

9. A photoelectric sensor circuit comprising:

a first light-receiving sensor and a second light-receiving sensor for respectively outputting a first photoelectric current and a second photoelectric current responsive to incident illumination; and a current mirror circuit for receiving said first photoelectric current and said second photoelectric current, and for outputting a first signal corresponding to said first photoelectric current and a second signal corresponding to amplified first photoelectric current, said current mirror circuit comprising:

a first transistor connected in series to said first light-receiving sensor between first and second terminals, for allowing a first current corresponding to said first photoelectric current to flow between said first and second terminals while said first transistor is turned on;

a second transistor, connected between said second terminal and a third terminal, for amplifying said first photoelectric current into a second current;

a third transistor, a base of which is connected to said first light-receiving sensor, and interposed between said second light-receiving sensor and bases of said first and second transistors, wherein said third transistor provides said second photoelectric current to said based of said first and second transistors to turn said first and second transistors on while being turned on by said first photoelectric current supplied to said base thereof, wherein said second light-receiving sensor is connected in series with said third transistor with respect to said second terminal.

10. A photoelectric sensor circuit according to claim 9, wherein, an emitter of said third transistor is connected to bases of said first transistor and said second transistor, and one side of said second light-receiving sensor is connected to a collector of said third transistor.

11. A photoelectric sensor circuit according to claim 10, wherein the other side of said second light-receiving sensor is connected to emitters of said first transistor and said second transistor.

12. A photoelectric sensor circuit according to claim 11, wherein the one side of said first light-receiving sensor is connected to a collector of said first transistor and a base of said third transistor.

13. A photoelectric sensor circuit according to claim 11, wherein said first terminal is a power terminal, said second terminal is a ground terminal, said one side of said second light-receiving sensor is an anode side, and the other side of said second light-receiving sensor is a cathode side.

14. A photoelectric sensor circuit according to claim 9, wherein said second light-receiving sensor includes at least two photodiodes connected in series.

15. A photoelectric sensor circuit according to claim 10, wherein an emitter area of said second transistor is larger than that of said first transistor.

16. A photoelectric sensor circuit according to claim 9, wherein said second light-receiving sensor is a photodiode, an anode of which is connected to a collector of said third transistor and a cathode of which is connected to said second terminal.

* * * * *